United States Patent
Bronner et al.

(10) Patent No.: US 8,497,544 B2
(45) Date of Patent: *Jul. 30, 2013

(54) REPAIRING DEFECTS IN A NONVOLATILE SEMICONDUCTOR MEMORY MODULE UTILIZING A HEATING ELEMENT

(75) Inventors: Gary B. Bronner, Los Altos, CA (US); Ming Li, Fremont, CA (US); Donald R. Mullen, Mountain View, CA (US); Frederick Ware, Los Altos Hills, CA (US); Kevin S. Donnelly, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/486,977

(22) Filed: Jun. 1, 2012

(65) Prior Publication Data

US 2012/0236668 A1    Sep. 20, 2012

Related U.S. Application Data

(63) Continuation of application No. 12/676,594, filed as application No. PCT/US2008/075261 on Sep. 4, 2008, now Pat. No. 8,193,573.

(60) Provisional application No. 60/970,223, filed on Sep. 5, 2007.

(51) Int. Cl.
*H01L 29/76* (2006.01)
*H01L 21/8238* (2006.01)

(52) U.S. Cl.
USPC ............ 257/314; 257/777; 257/E25.018; 257/E23.081; 257/E27.084; 257/E27.102; 257/E27.104; 257/E21.209; 257/E21.646; 257/E21.662; 257/21.665; 257/E21.68; 438/201

(58) Field of Classification Search
None
See application file for complete search history.

(56) References Cited

U.S. PATENT DOCUMENTS

| 3,383,614 A | 5/1968 | Emmons et al. ............... 330/23 |
| 4,374,316 A | 2/1983 | Inamori et al. ............... 219/209 |
| 5,898,706 A | 4/1999 | Dufresne et al. ............... 371/28 |
| 5,956,350 A | 9/1999 | Irrinki et al. ............... 371/21.1 |
| 6,009,033 A | 12/1999 | Li et al. ............... 365/212 |
| 7,719,048 B1 | 5/2010 | Babcock et al. ............... 257/316 |
| 8,193,573 B2 * | 6/2012 | Bronner et al. ............... 257/314 |
| 2004/0013263 A1 | 1/2004 | Maclean ............... 379/387.01 |

(Continued)

FOREIGN PATENT DOCUMENTS
EP    0540287 A2    5/1993

OTHER PUBLICATIONS

Kelleher et al., "Investigation of On-chip High Temperature Annealing of PMOS Dosimeters," IEEE Transactions on Nuclear Science, IEEE Service Center, New York, NY, US. vol. 43, No. 3, Jun. 1996, pp. 997-1001. 6 pages.

(Continued)

*Primary Examiner* — Alonzo Chambliss
(74) *Attorney, Agent, or Firm* — Charles Shemwell

(57) ABSTRACT

A memory module includes multiple memory devices mounted to a substrate and one or more discrete heating elements disposed in thermal contact with the memory devices. Each of the memory devices includes charge-storing memory cells subject to operation-induced defects that degrade ability of the memory cells to store data. The discrete heating elements, or single discrete heating element, heats the memory devices to a temperature that anneals the defects.

28 Claims, 9 Drawing Sheets

U.S. PATENT DOCUMENTS

| | | | |
|---|---|---|---|
| 2005/0224849 A1 | 10/2005 | Isenberger et al. | 257/295 |
| 2005/0236662 A1 | 10/2005 | Lee | 257/319 |
| 2006/0103007 A1 | 5/2006 | Aitken et al. | 257/706 |
| 2006/0140005 A1 | 6/2006 | Yeh | 365/185.21 |
| 2007/0268736 A1 | 11/2007 | Cannon et al. | 365/148 |
| 2008/0089134 A1 | 4/2008 | Ito | 365/185.29 |
| 2008/0263266 A1 | 10/2008 | Sharon et al. | 711/103 |
| 2009/0285030 A1 | 11/2009 | Kang et al. | 365/185.28 |

OTHER PUBLICATIONS

Chabrerie et al., "A New Integrated Test Structure for on-chip Post-Irradiation Annealing in MOS Devices," IEEE Transactions on Nuclear Science, IEEE Service Center, New York, NY, US. vol. 45, No. 3, Jun. 1998, pp. 1438-1443. 6 pages.

International Preliminary Report on Patentability dated Dec. 23, 2008 for PCT/US2007/085979. 6 pages.

Written Opinion dated Mar. 24, 2009 for International Application No. PCT/US2007/085979. 8 pages.

International Search Report dated Apr. 28, 2008 for International Application No. PCT/US2007/085979. 5 pages.

Response submitted Mar. 2, 2010 re Notice of Non-Compliance for U.S. Appl. No. 12/516,499. 3 pages.

Preliminary Amendment dated Mar. 4, 2010, re U.S. Appl. No. 12/676,594. 12 pages.

International Search Report and Written Opinion issued in PCT/US2008/075261, Mar. 24, 2009. 20 pages.

International Preliminary Report on Patentability (Chapter I) with mail date of Mar. 18, 2010 re International Application No. PCT/US2008/075261, Includes Written Opinion. 7 pages.

Request for Examination dated Aug. 5, 2010, re JP Application No. 2009-539495 (Japanese Translation Only). 2 pages.

International Search Report and Written Opinion with mail date of Aug. 30, 2010 for International Application No. PCT/US2010/040322. 9 pages.

EP Office Communication pursuant to Article 94(3) EPC, dated Sep. 28, 2010 in EP Application No. 08799167.5—2210. 4 pages.

Preliminary Amendment dated Oct. 12, 2010 re U.S. Appl. No. 12/859,554. 10 pages.

Preliminary Amendment dated Nov. 16, 2010 re U.S. Appl. No. 12/516,499. 10 pages.

Bronner, Gary, U.S. Appl. No. 12/516,499 filed May 27, 2009, re Office Action with mail date of Feb. 2, 2011. 29 pages.

Bronner, Gary, U.S. Appl. No. 12/516,499 filed May 27, 2009, re Response dated Mar. 21, 2011 to the Office Action of Feb. 2, 2011. 17 pages.

EP Response dated Apr. 7, 2011 to the Official Communication dated Sep. 28, 2010 re EP Application No. 08799167.5. 18 pages.

Final Office Action with mail date of May 20, 2011 re U.S. Appl. No. 12/516,499. 34 pages.

Bronner, Gary, U.S. Appl. No. 12/676,594 filed Mar. 4, 2010, re Preliminary Amendment dated Jun. 13, 2011. 7 pages.

Bronner, Gary, U.S. Appl. No. 12/516,499 filed May 27, 2009, re Response dated Jun. 30, 2011 to the Final Office Action mailed May 20, 2011. 17 pages.

Bronner, Gary, U.S. Appl. No. 12/516,499 filed May 27, 2009, re Statement of Substance of Examiner Interview dated Jul. 5, 2011. 1 page.

Bronner, Gary, U.S. Appl. No. 12/516,499 filed May 27, 2009, re Office Action dated Jul. 19, 2011 re Advisory Action Before the Filing of an Appeal Brief. 5 pages.

Bronner, Gary, U.S. Appl. No. 12/676,594 filed Mar. 4, 2010, re Supplemental Preliminary Amendment dated Jul. 28, 2011. 7 pages.

JP Voluntary Amendment dated Aug. 30, 2011, Petition and Request for Examination re JP Application No. 2010-524138. 8 pages.

Shaeffer, Ian, U.S. Appl. No. 12/859,554 filed Aug. 19, 2010, re Office Action mailed Dec. 5, 2011. 23 pages.

Bronner, Gary, U.S. Appl. No. 12/676,594 filed Mar. 4, 2010, re Office Action mailed Dec. 28, 2011. 18 pages.

Bronner, Gary, U.S. Appl. No. 12/676,594 filed Mar. 4, 2010, re Request for Continued Examination submitted Jan. 17, 2012, Includes Response. 9 pages.

Bronner, Gary, U.S. Appl. No. 12/676,594 filed Mar. 4, 2010, re Office Action dated Jan. 30, 2012. 18 pages.

International Preliminary Report on Patentability (Chapter I) dated Mar. 1, 2012 re International Application No. PCT/US10/040322. 6 pages.

Bronner, Gary, U.S. Appl. No. 12/676,594 filed Mar. 4, 2010, re Response dated Mar. 8, 2012 to the Office Action of Jan. 30, 2012. 9 pages.

Shaeffer, Ian, U.S. Appl. No. 12/859,554 filed Aug. 19, 2010, re Response dated Apr. 2, 2012 to the Office Action of Dec. 5, 2012. 15 pages.

Bronner, Gary, U.S. Appl. No. 12/676,594 filed Mar. 4, 2010, re Notice of Allowance and Fee(s) Due mailed Apr. 9, 2012. 14 pages.

* cited by examiner

REPAIRING DEFECTS IN A NONVOLATILE SEMICONDUCTOR MEMORY MODULE UTILIZING A HEATING ELEMENT

CROSS REFERENCE TO RELATED APPLICATIONS

This application is a continuation of U.S. patent application Ser. No. 12/676,594, now U.S. Pat. No. 8,193,573 which is a United States National Stage Application filed under 35 U.S.C. §371 of PCT Patent Application No. PCT/US2008/075261 filed on Sep. 4, 2008, which claims the benefit of and priority to U.S. Provisional Patent Application No. 60/970,223 filed on Sep. 5, 2007, the disclosures of all of which are hereby incorporated by reference in their entirety.

TECHNICAL FIELD

The disclosed embodiments relate generally to repairing semiconductor devices, and more particularly, to annealing packaged nonvolatile semiconductor memory devices to improve memory endurance or other characteristics that change with usage.

BACKGROUND

Nonvolatile semiconductor memory devices such as flash memory can only perform a limited number of write and erase cycles before memory cells lose the ability to store data properly. Specifically, device operation generates defects, such as defects in the tunneling insulator, that trap charge, thereby degrading the ability of memory cells to store data. For example, a flash memory device may be limited to 10,000 write cycles or fewer. The time needed to program or erase a memory cell may also degrade with usage and the device is specified for the worst case characteristics.

BRIEF DESCRIPTION OF THE DRAWINGS

Like reference numerals refer to corresponding parts throughout the drawings. For visual clarity and ease of description, cross-hatching has been omitted for various elements in the cross-sectional views.

DESCRIPTION OF EMBODIMENTS

Figure 1A:
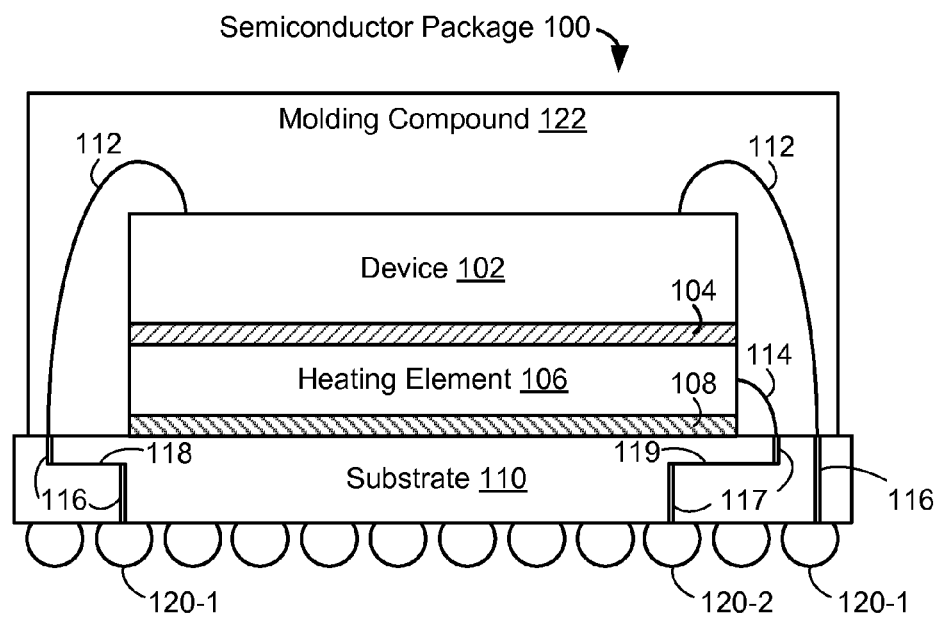
FIGS. 1A and 1B are cross-sectional views of a semiconductor package in accordance with some embodiments.

In some embodiments, a method of repairing a nonvolatile semiconductor memory device includes monitoring an event indicator associated with the nonvolatile semiconductor memory device. An event is then detected with the event indicator. Finally, in response to detecting the event, the nonvolatile semiconductor memory device is annealed.

In some embodiments, a semiconductor apparatus is self-annealing, wherein annealing is performed in a normal operating environment of the apparatus. The apparatus includes a nonvolatile semiconductor memory device; a heating element thermally coupled to the memory device, to anneal the device; a first set of electrical contacts electrically coupled to the memory device, to provide signals to the memory device; and a second set of electrical contacts electrically coupled to the heating element, to provide power to the heating element.

Reference will now be made in detail to various embodiments, examples of which are illustrated in the accompanying drawings. In the following detailed description, numerous specific details are set forth in order to provide a thorough understanding of the disclosure herein. However, it will be apparent to one of ordinary skill in the art that the described embodiments may be practiced without these specific details. In other instances, well-known methods, procedures, components, and circuits have not been described in detail so as not to unnecessarily obscure aspects of the embodiments.

The term semiconductor package, or simply package, as used herein, refers to a component, to be mounted on a substrate (such as a printed circuit board), containing one or more semiconductor die and providing electrical connections between the die and the substrate. The term memory module, or simply module, as used herein, refers to a substrate (i.e. printed circuit board), on which are mounted packages containing semiconductor memory devices (i.e., semiconductor memory die), configured to be electrically coupled to (e.g., plugged into) another substrate such as a motherboard.

Operation of nonvolatile semiconductor memory devices, such as flash memory, induces defects that trap charge or provide leakage paths for stored charge and thereby shift the threshold voltages of transistors in corresponding memory cells. This degrades the ability of the memory cells to receive and store data written to the cells. Over time, the voltage margin in the cells degrades to the point where ones written to the cells cannot be distinguished from zeros written to the cells, thereby resulting in memory errors when cells are read, i.e., their stored values do not match the values previously written to the cells.

The term flash memory as used herein includes flash memory semiconductor devices with floating gates and/or charge-trapping memory semiconductor devices such as SONOS (semiconductor-oxide-nitride-oxide semiconductor), TANOS (Ta/Al2O3/SiN/SiO2/Si), nanocrystal memory device, and related technologies such as NAND, NOR, synchronous versions of both, EEPROMS, etc.

To improve the endurance and lifetime of flash memory semiconductor devices, the devices may be repaired through an annealing process to passivate and/or eliminate defects induced by device operation. The term annealing as used herein refers to heating a device to a sufficient junction temperature for a sufficient period of time to reduce or eliminate defects. For example, this period of time may be from seconds up to minutes, but in less than an hour. The term junction temperature as used herein refers to the temperature of the device at the active layers of the device, such as in the memory cells of a flash memory semiconductor device. The term self-annealing, as used herein, refers to an apparatus configured to be annealed in situ in its normal operating environment between periods of operation.

In some embodiments, a flash memory semiconductor device that has been packaged, assembled in a system, and used in operation, may be annealed using a heating element that is thermally coupled to the device. For example, the heating element may be a component within the semiconductor package containing the device or may be externally mounted to the package such that heat conducts from the heating element to the package, and thereby to the device, when power is supplied to the heating element.

In some embodiments, to anneal a device, the heating element is heated to an annealing temperature corresponding to a junction temperature of between 200° C.-300° C. In other embodiments, the heating element is heated to an annealing temperature corresponding to a junction temperature of between 200° C.-250° C. In still further embodiments, the heating element is heated to an annealing temperature corresponding to a junction temperature of between 250° C.-300° C. Finally, even lower temperatures, such as 150° C.-200° C., have been shown to be useful for in-situ annealing.

In some embodiments, the maximum annealing temperature of the heating element is limited by characteristics of the semiconductor package containing the device or of the printed circuit board to which the package is coupled. For example, the temperature is limited by the reflow temperature of solder used as a packaging material or by substrate glass transition temperatures.

FIG. 1A is a cross-sectional view of a semiconductor package 100 in accordance with some embodiments. The package 100 contains a nonvolatile semiconductor memory device 102, such as a flash memory die. In some embodiments, the device 102 is a die containing SONOS memory. The device 102 is electrically coupled to a substrate 110 through wirebonds 112. Vias 116 and electrical traces 118 in the substrate 110 provide electrical pathways between wirebonds 112 and respective solder balls 120-1. The solder balls 120-1 serve as electrical contacts to provide power and ground connections, as well as signals to the device 102.

The device 102 is mounted on a heating element 106 with a thermally conductive adhesive layer 104. For example, the adhesive layer 104 may be thermally conductive tape or film, such as tape or film with a thermal conductivity at a minimum of about 1 W/mK. Alternatively, the adhesive layer 104 is a thermal paste or adhesive. In some embodiments, a spacer (e.g., a silicon spacer with a thickness of approximately 25 to 50 um) is included between the device 102 and the heating element 106.

In some embodiments, the heating element 106 is a thin-film heater. Exemplary materials from which the thin-film heater is manufactured include polyimide, silicone rubber, or a ceramic material such as mica. Examples of suitable thin-film heaters include a number of heaters manufactured by MINCO (www.minco.com), like its HTK04 All-Polyimide (AP) Heaters, or its HTK05 Polyimide Thermofoil Heaters (where these heaters have to be customer designed to fit the package profile). An alternative heating element is a thick-film heater like that manufactured by CHROMALOX and WATLOW.

The heating element 106 is mounted on the laminate substrate 110 with an adhesive layer (e.g., tape or film) 108, which in some embodiments is not thermally conductive. For example, non-conductive tape or film 108 may have a thermal conductivity of approximately 0.2 W/mK. The heating element is electrically coupled to solder balls 120-2 through electrical connections (e.g., wires with wire bonding on slightly larger heating element 106) 114 and through vias 117 and/or traces 119 in the substrate 110. The solder balls 120-2 serve as electrical contacts to provide power to the heating element. In some embodiments, the electrical connections 114 include a power connection and a ground connection.

The solder balls 120 thus include two sets of contacts: a first set of contacts (i.e., solder balls 120-1) to provide signals to the device 102 and a second set of contacts (i.e., solder balls 120-2) to provide power to the heating element 106. It should be noted that the contacts may be electrical connections other than solder balls.

Figure 1B:
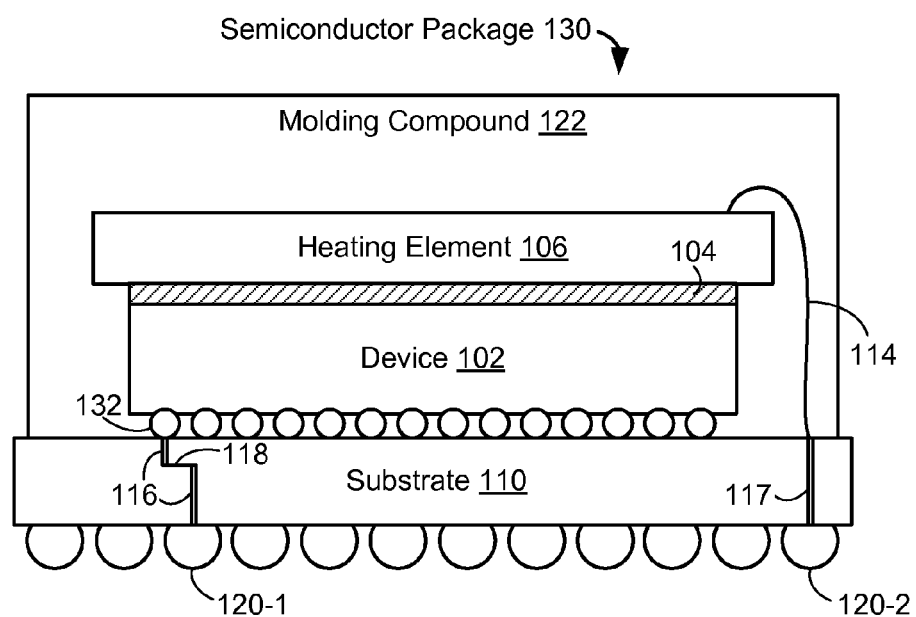

In some embodiments, the package 100 includes a temperature sensor to monitor the annealing temperature. In some embodiments, the temperature sensor is electrically accessible from outside of the package. For example, the temperature sensor provides feedback to a controller that regulates power provided to the heating element 106, to maintain the annealing temperature at a predefined temperature or within a predefined range. Alternatively, the temperature sensor writes temperature readings to a memory accessible by a controller. In some embodiments, the temperature sensor is integrated into the device 102 and is electrically coupled to the controller or memory through one or more wirebonds 112 (or metal balls or bumps 132, as shown in FIG. 1B), vias 116, traces 118, and solder balls 120-1. In some embodiments, the temperature sensor is integrated into the heating element 106 and is electrically coupled to the controller or memory through one or more electrical connections 114, vias 117, traces 119, and solder balls 120-2. In some embodiments, the temperature sensor is a discrete component of the package 100.

The device 102, heating element 106, and wirebonds 112 are encased in molding compound 122. In some embodiments, the molding compound 122 has a sufficiently high glass transition temperature to ensure that annealing does not compromise the integrity of the casing formed by the molding compound 122.

Having the heating element 106 in the package 100 allows the package to be self-annealing: the device 102 may be annealed in situ in the package 106 in its normal operating environment, after a period of operation, to reduce or eliminate defects. For example, the device 102 may be annealed after the package 100 has been mounted on a printed circuit board and operated for a period of time in an electronic system.

FIG. 1B is a cross-sectional view of a semiconductor package 130 in accordance with some embodiments. In the package 130, the device 102 is coupled to the substrate 110 using flip-chip bonding: metal balls or bumps 132 provide electrical connections between the device 102 and the substrate 110. Vias 116 and traces 118 in the substrate 110 provide electrical pathways between the metal balls or bumps 132 and respective solder balls 120-1. The heating element 106 is mounted on the device 102 with a thermally conductive adhesive layer 104 and is electrically coupled to solder balls 120-2 through electrical connections 114 and through vias 117 and traces 119 in the substrate 110. The device 102, heating element 106, and electrical connections 114 are encased in molding compound 122. In some embodiments, underfill material fills the space surrounding the metal balls or bumps 132 between the device 102 and the substrate 110.

Packages 100 and 130, which are shown as ball-grid array (BGA) packages with solder balls 120, are merely exemplary packages in which a heating element is thermally coupled to a nonvolatile semiconductor memory device. In some embodiments, instead of a BGA, the package may include a pin-grid array (PGA), a land-grid array (LGA), or metal leads. In some embodiments, instead of a laminate substrate, the device and/or heating element may be mounted on some other suitable substrate or on the paddle of a leadframe. In some embodiments, instead of being encased in molding compound, the device and heating element may be contained in some other suitable housing, such as a ceramic casing or a metal cover attached to the heating element 106 with thermally insulating film or tape.

In some embodiments, in addition to a nonvolatile semiconductor memory device and a heating element, a package may contain one or more additional semiconductor devices. The additional semiconductor devices may include additional nonvolatile semiconductor memory devices (e.g., additional flash memory devices) and may include other types of semiconductor devices, such as volatile memory devices (e.g., DRAM or SRAM). In some embodiments, the semiconductor devices are stacked in the package. For example, a heating element may be stacked between a nonvolatile semiconductor memory device and an additional device. The package also may contain additional heating elements to anneal the additional devices. In some embodiments, the additional heating elements are interleaved with the semiconductor devices in a stack.

Figure 1C:
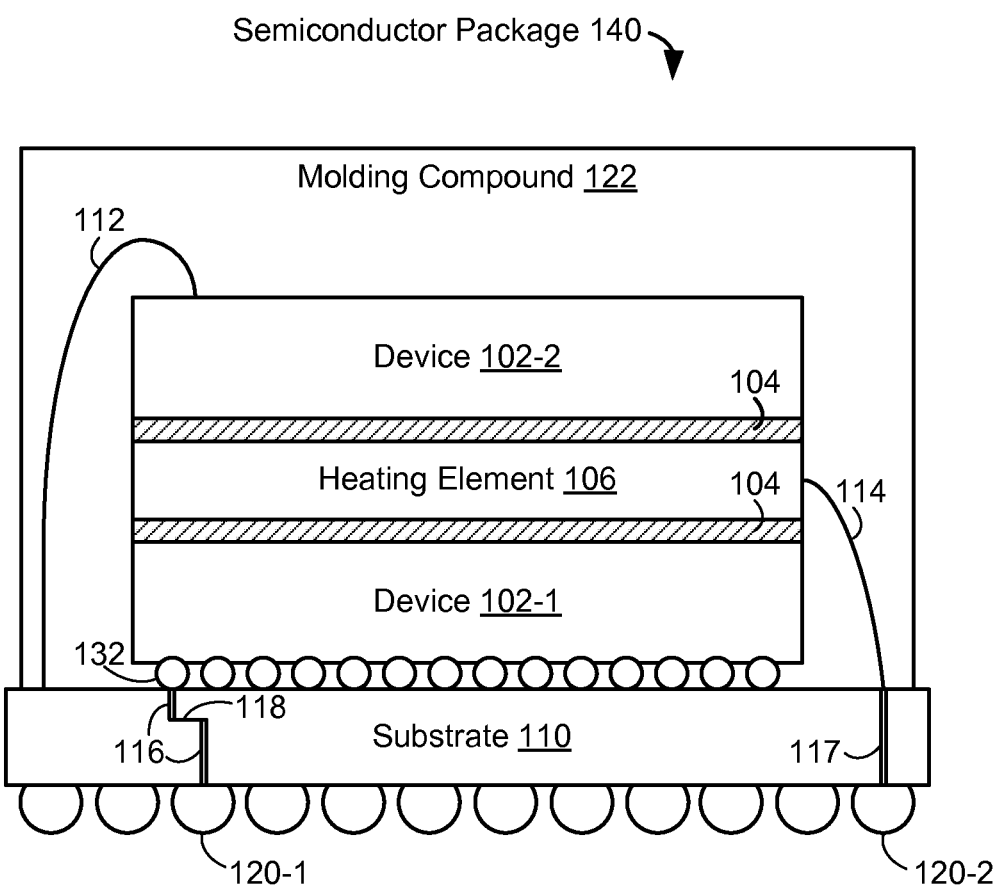
FIG. 1C is a cross-sectional view of a semiconductor package containing multiple semiconductor devices and a heating element in accordance with some embodiments.

FIG. 1C is a cross-sectional view of a semiconductor package 140 containing two semiconductor devices 102 and a heating element 106 in accordance with some embodiments. The devices 102 are configured in a stack, with the heating element 106 interleaved between the devices. Thermally conductive adhesive layers 104 conduct heat from the heating element 106 to the devices 102.

The devices 102 are electrically coupled to solder balls 120-1 through wirebonds 112 or metal balls or bumps 132, and through vias 116 and traces 118. While FIG. 1C shows a flip-chip device 102-1 and a wirebonded device 102-2, in some embodiments both devices 102-1 and 102-2 are wirebonded. The heating element 106 is electrically coupled to solder balls 120-2 through electrical connections 114 and through vias 117 and/or traces.

Figure 1D:
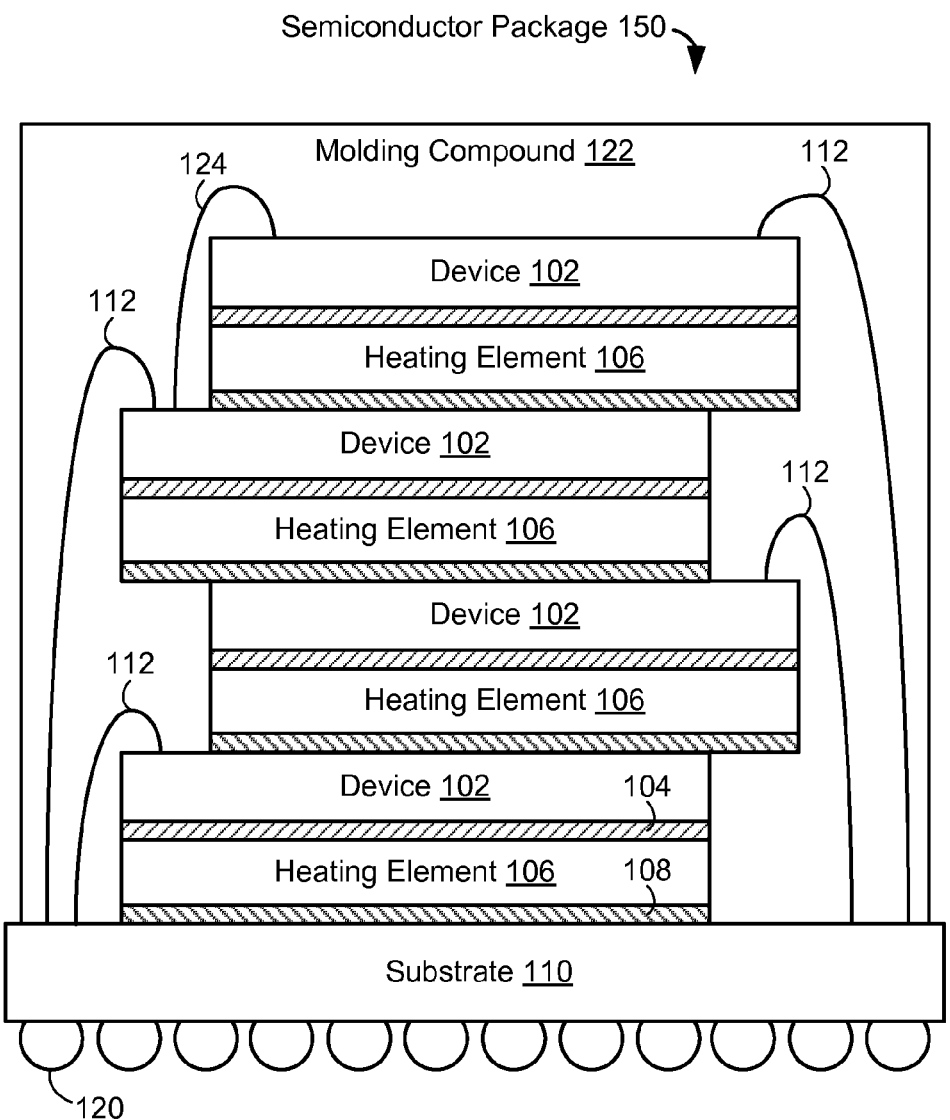
FIG. 1D is a cross-sectional view of a semiconductor package containing multiple semiconductor devices and multiple heating elements in accordance with some embodiments.

FIG. 1D is a cross-sectional view of a semiconductor package 150 containing multiple semiconductor devices 102 and multiple heating elements 106 in accordance with some embodiments. The devices 102 and heating elements 106 are interleaved in a stack. A respective device 102 is mounted on a heating element 106 below the respective device 102 with a thermally conductive adhesive layer 104. A respective heating element 106 is mounted on a device 102 below the respective heating element 106, or on the substrate 110, with die attach tape or film 108.

The devices 102 are electrically coupled to solder balls 120 through wirebonds 112 and through vias 116 and traces 118, as shown in FIGS. 1A-1C. Furthermore, in some embodiments wirebonds 124 electrically couple two devices 102. For example, wirebonds 124 may serially connect successive devices 102. The heating elements 106 are electrically coupled to solder balls 120-2 through electrical connections 114 and through vias 117 and traces 119, as shown in FIGS. 1A-1C.

Figure 2:
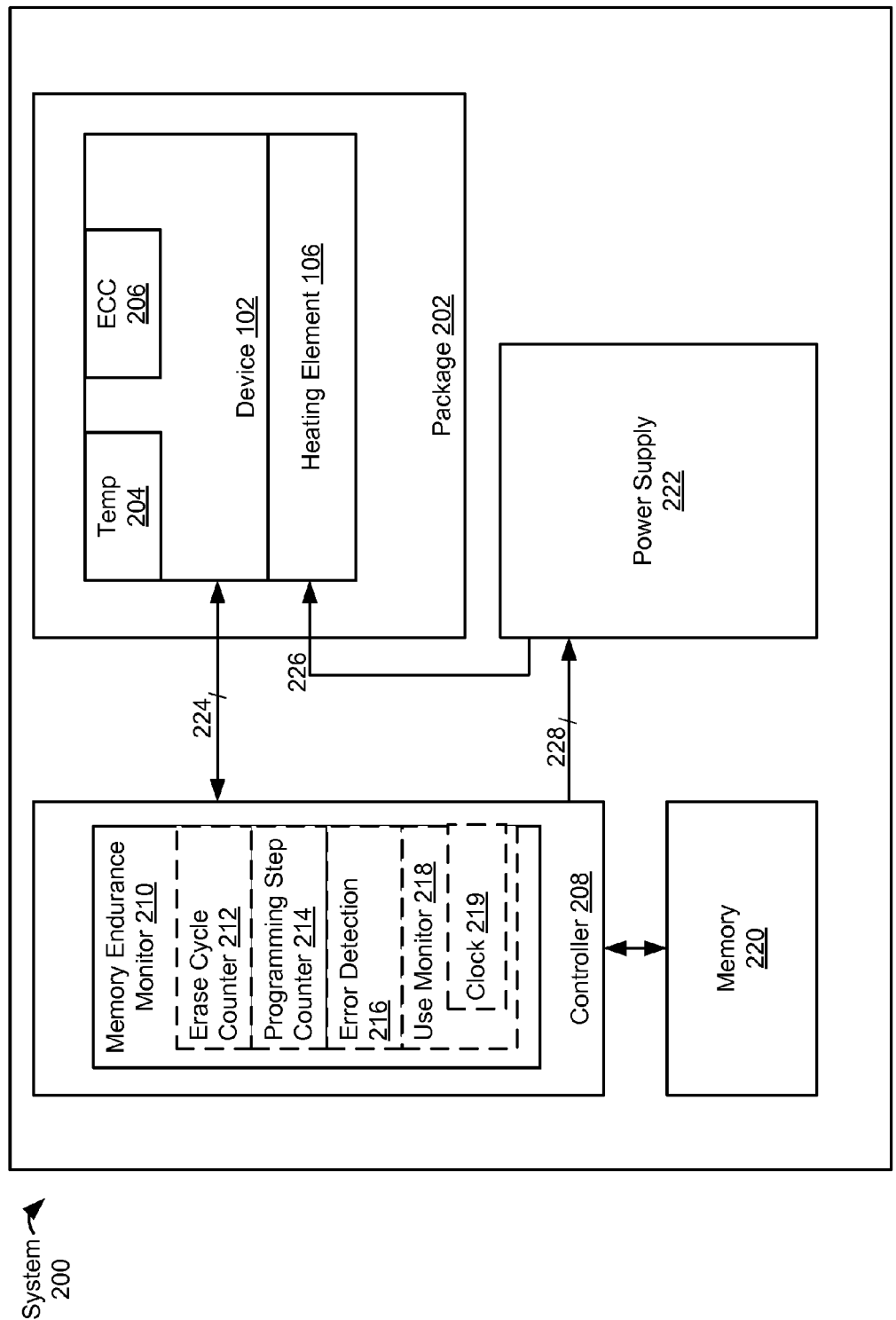
FIG. 2 is a block diagram of an electronic system that includes a semiconductor package in accordance with some embodiments.

FIG. 2 is a block diagram of an electronic system 200 that includes a self-annealing semiconductor package 202 in accordance with some embodiments. Examples of self-annealing semiconductor packages 202 include packages 100, 130, 140, and 150 (FIGS. 1A-1D). The system 200 may be any system that uses nonvolatile semiconductor memory such as flash memory. In some embodiments, the system 200 is a mobile application, such as a cell phone, personal digital assistant (PDA), or music player.

The package 202 includes a nonvolatile semiconductor memory device 102 and a heating element 106. In some embodiments, the package 202 includes a temperature sensor 204. The temperature sensor 204 may be integrated into the device 102. Alternatively, the temperature sensor may be integrated into the heating element 106. The device 102 also may include error correction coding (ECC) circuitry to detect memory errors.

The package 202 is coupled to a controller 208 (e.g., a microprocessor or microcontroller) via signal lines 224. The controller 208 is configured to determine when to anneal the device 102 and to initiate the annealing process. For example, the controller 208 instructs a power supply 222 to provide power to the heating element 106 via electrical connections 226, thereby heating the heating element.

In some embodiments, the controller 208 includes a memory endurance monitor 210 that monitors a memory endurance indicator for the device 102 to determine when to anneal the device. The monitor 210 determines whether the indicator exceeds a predefined limit and, in response to determining that the indicator exceeds the limit, initiates the annealing process.

In some embodiments, the memory endurance monitor 210 includes an erase cycle counter 212 to record a count of erase cycles performed by the device 102. The monitor 210 compares the recorded count against a predefined count to determine whether to anneal the device 102. The predefined count is determined, for example, by characterizing the nonvolatile memory cells of the type (i.e., of the cell design and process technology) used in the device 102 to determine a maximum number of erase cycles that the device 102 reliably can perform. In some embodiments, after the device 102 has been annealed, the recorded count is reset to zero. The erase cycle counter 212 then records a count of subsequent erase cycles performed by the device 102. The monitor 210 compares the count of subsequent erase cycles against the predefined count, to determine whether to anneal the device 102 again. Alternately, instead of resetting the recorded count to zero, the erase cycle counter 212 continues to increment the recorded count, and the monitor 210 determines that the device is to be annealed again when the recorded count reaches an integer multiple of the predefined count.

In some embodiments, the memory endurance monitor 210 includes a programming step counter 214 to record a number of programming steps performed to program the device 102. The monitor 210 compares the recorded number of programming steps against a predefined number to determine whether to anneal the device 102. The predefined number may be defined as a predetermined percentage or number of steps above a baseline number of steps.

In some embodiments, the memory endurance monitor 210 includes error detection circuitry 216 to record a count of errors detected for the device 102. The monitor 210 compares the recorded count of errors against a predefined number to determine whether to anneal the device 102. Alternatively, ECC circuitry 206 in the device 102 records a count of errors and reports the recorded count to the controller 208 or signals the controller 208 when the count exceeds a predefined number. In some embodiments, after the device 102 has been annealed, the recorded count of errors is reset to zero. The error detection circuitry 216 then records a subsequent count of errors and the monitor 210 compares the subsequent count of errors against the predefined number, to determine whether to anneal the device 102 again.

In some embodiments, the memory endurance monitor 210 includes a use monitor 218 to record a period of use for the device 102. The use monitor 218 may include a clock 219, or may be coupled to a clock external to the use monitor 218. The monitor 210 compares the recorded period of use against a predefined length of time to determine whether to anneal the device 102. In some embodiments, after the device 102 has been annealed, the recorded period of use is reset to zero. The use monitor 218 then records a subsequent period of use and the monitor 210 compares the subsequent period of use against the predefined length of time, to determine whether to anneal the device 102 again. Alternately, instead of resetting the period of use to zero, the user monitor 218 continues to record the period of use and the monitor 210 determines that the device is to be annealed again when the recorded period of use reaches an integer multiple of the predefined length of time.

In some embodiments, the device 102 can only be annealed a specified number of times. The controller 208 records the number of times that the device has been annealed and will not initiate the annealing process if the recorded number of times equals or exceeds the specified number of times.

In some embodiments in which the system 200 is a mobile application or other type of battery-powered application, the controller 208 will delay annealing until the system 200 is plugged into a power supply to charge the battery. The controller 208 thus assures that sufficient power is available for annealing.

In some embodiments in which the system 200 is a mobile application or other type of battery-powered application, the controller 208 will anneal the system whenever 200 is plugged into a power supply to charge the battery. This opportunistic annealing does not rely upon memory endurance monitors. Rather it only senses when power is available for annealing.

In some embodiments, during annealing, the controller 208 monitors an annealing temperature as reported by the temperature sensor 204. The controller adjusts the power supplied to the heating element 106 to maintain the annealing temperature within a predetermined temperature range corresponding to a predetermined range of junction temperatures for the device 102. For example, based on feedback from the temperature sensor 204, the controller 208 instructs the power supply 222 to adjust the level of power supplied to the heating element 106, to maintain the annealing temperature within the predetermined range. In other embodiments, instead of adjusting the level of power based on feedback, a predefined level of power is supplied to the heating element 106.

The annealing process may corrupt data stored in the device 102. Therefore, in some embodiments, the controller 208 copies the data stored in the device 102 into another memory 220 prior to annealing, and copies the data back into the device 102 upon completion of the annealing. The memory 220 may be any suitable memory device within or coupled to the system 200. For example, the memory 220 may include one or more semiconductor memory devices or magnetic or optical disk storage devices within the system 200. The memory 220 may include a memory stick or memory card inserted into the system 200. The memory 220 may include memory in another system to which the system 200 is coupled, either directly or through a network (e.g., through the internet). For example, the data may be transferred to a computer to which the system 200 is coupled to charge or synchronize the system 200. In another example, the data may be uploaded to a server and then downloaded to the device 102 upon completion of annealing.

In some embodiments, one or more of the above-identified functions performed by the controller 208 are implemented in software, and thus may correspond to sets of instructions for performing these functions. These sets of instructions, which may be stored in the device 102 or other memory 220, need not be implemented as separate software programs, procedures or modules, and thus subsets of these sets of instructions may be combined or otherwise re-arranged in various embodiments.

FIGS. 1A-1D and FIG. 2 describe embodiments in which a heating element is housed within a package containing a nonvolatile semiconductor memory device to be annealed. However, in some embodiments, the heating element is external to the package. For example, an external heating element is thermally coupled to the exterior of a package (or several packages) mounted on a printed circuit board. In some embodiments, the printed circuit board is a motherboard or a circuit board coupled to a motherboard, such as a module (e.g., a single- or dual-inline memory module (SIMM or DIMM)) or daughtercard. In some embodiments, the printed circuit board includes a rigid substrate; in other embodiments, the substrate is flexible. In some embodiments, the heating element is a thin-film heater, as described with respect to heating element 106.

Figure 3A:
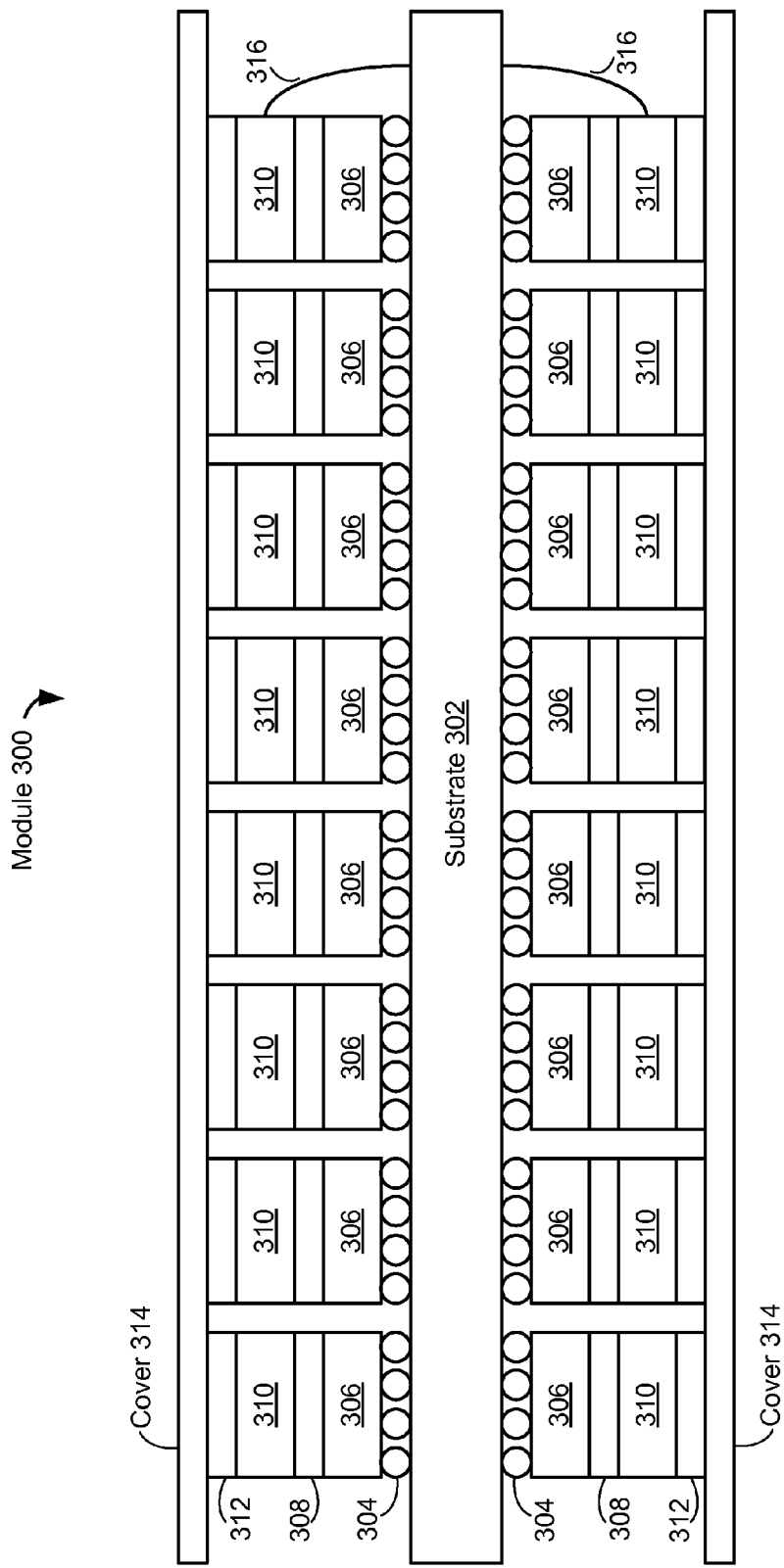
FIGS. 3A and 3B are cross-sectional views of a module in accordance with some embodiments.

FIG. 3A is a cross-sectional view of a module 300 in accordance with some embodiments. The module 300 is shown as a module (e.g., a DIMM) that includes packaged nonvolatile semiconductor memory devices 306 mounted on a laminate substrate 302. A respective packaged device 306 includes a die containing nonvolatile semiconductor memory such as flash memory. In some embodiments, the respective device 306 includes a die containing SONOS memory. In some embodiments, the respective device 306 includes multiple die. The multiple die may include multiple die of nonvolatile semiconductor memory and may include other types of semiconductor devices, such as volatile semiconductor memory.

In the example of FIG. 3A, the packaged devices 306 are BGA-type packages, with solder balls 304 providing electrical and mechanical connections between the devices 306 and the substrate 302. In some other embodiments, a packaged device may be a PGA- or LGA-type device or may include metal leads to provide electrical and mechanical connections between the device and the substrate.

Heating elements 310 are mounted on respective devices 306. Thermal interface material 308, such as thermally conductive tape, film, paste, or adhesive, conducts heat from a heating element 310 to a respective device 306. Electrical connections (e.g., wires) 316 couple the heating elements 310 to the substrate 302, thus providing power and ground connections to the heating elements 310. (For clarity, FIG. 3A shows only a single electrical connection 316 for a corresponding heating element 310.) The heating elements 310 allow the module 300 to be self-annealing: the devices 306 may be annealed on the module 300 after a period of operation, to reduce or eliminate defects.

Optional cover 314 is attached to the heating elements 310 through thermally insulating layers 312. The layers 312 may include tape, film, paste, or adhesive. In some embodiments, the cover 314 is thermally insulating (e.g., plastic). Use of a thermally insulating cover helps to retain heat generated by the heating elements 310, thereby reducing the power needed to reach the annealing temperature range and thus improving the efficiency of the heating elements 310.

In the example of FIG. 3A, separate heating elements 310 are mounted on and, thereby, thermally coupled to respective packaged devices 306. In some embodiments, however, a single heating element is thermally coupled to multiple packaged devices. Using a single heating element for multiple packaged devices reduces the number of components and simplifies assembly of the module.

Figure 3B:
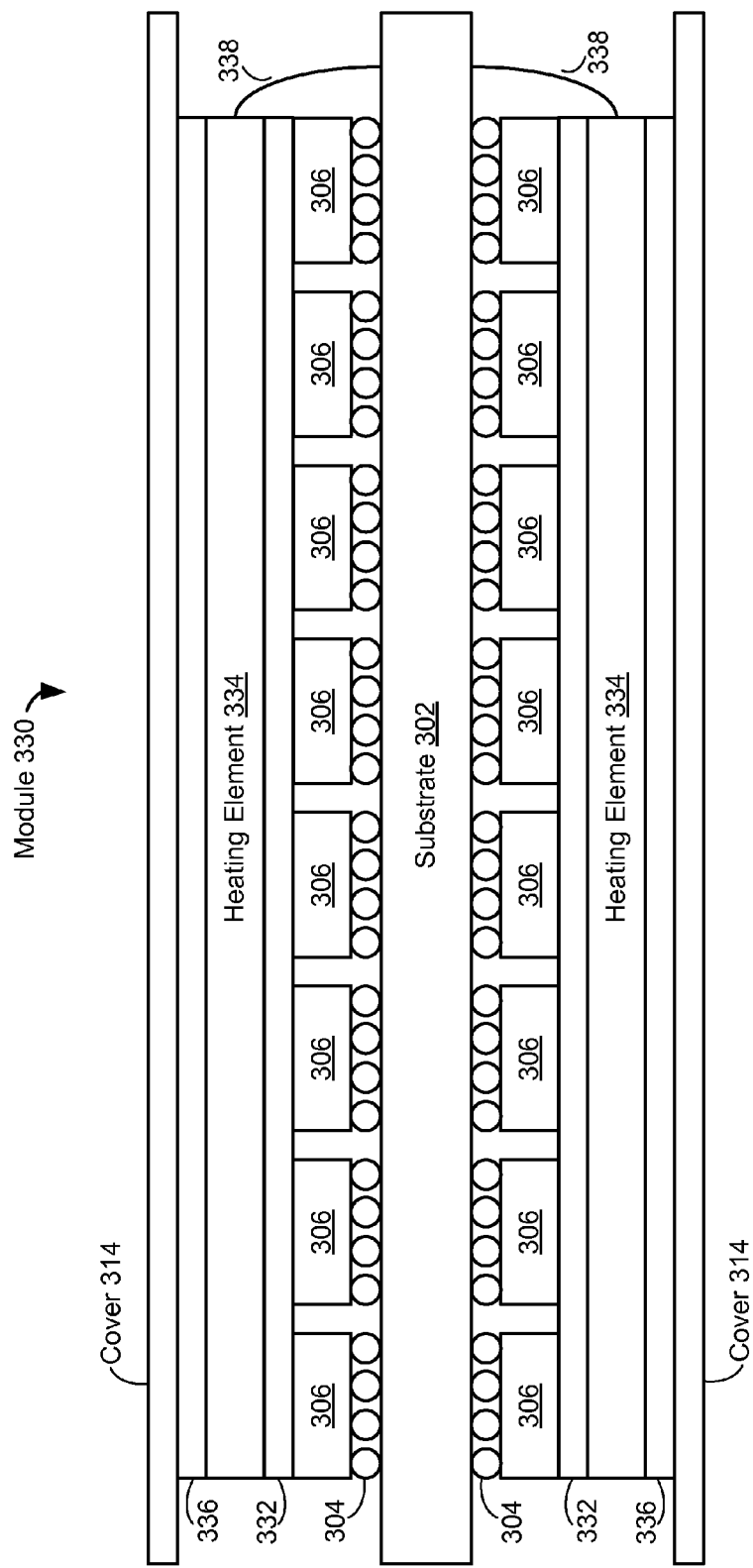

For example, FIG. 3B shows a module 330 in which a single heating element 334 covers multiple packaged devices 306 on a respective side of the substrate 302, in accordance with some embodiments. Thermal interface material 332 conducts heat from the heating element 334 to the devices 306.

Electrical connections 338 couple the heating element 334 to the substrate 302. In some embodiments, the electrical connections 338 couple the heating element 334 to the external system, like a motherboard in PC system. The cover 314 is attached to the heating element 334 with a thermally insulating adhesive layer 336.

Figure 3C:
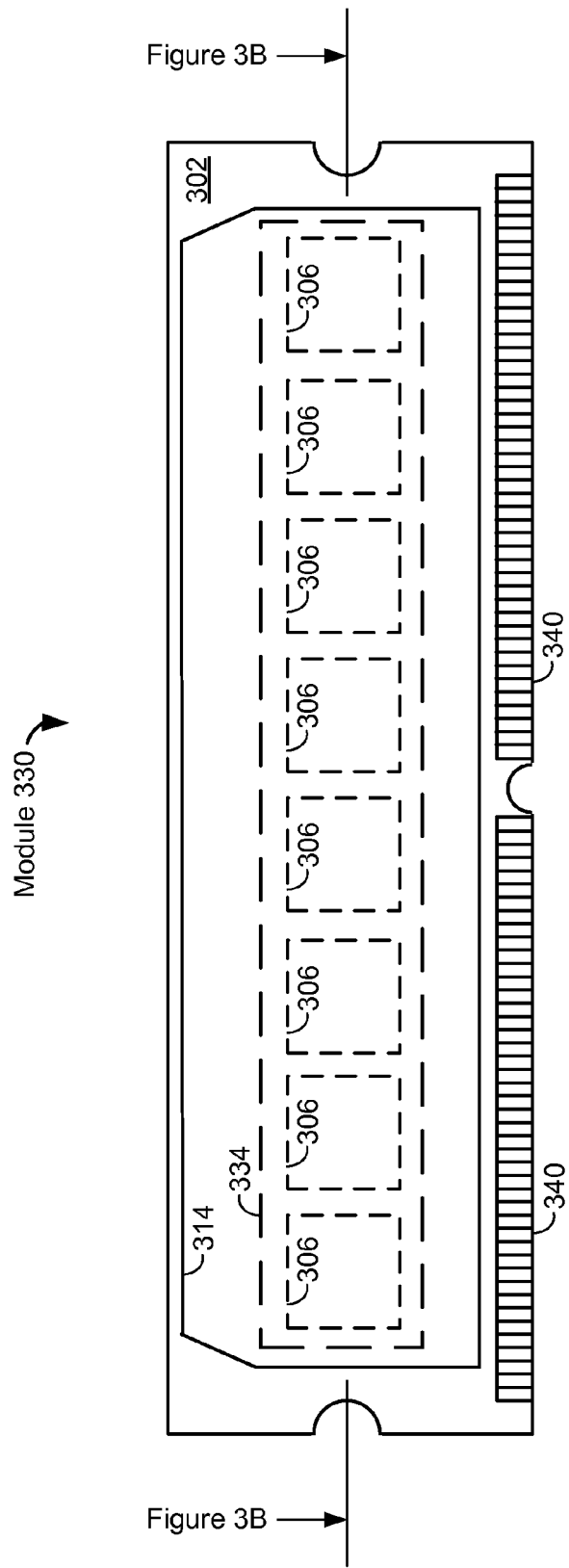
FIG. 3C is a plan view of a module in accordance with some embodiments.

FIG. 3C is a plan view of the module 330 in accordance with some embodiments. The heating element 334 and packaged devices 306 are shown with dashed outlines to indicate that they are beneath the cover 314. The module 330 includes electrical contacts (i.e., edge fingers) 340. In some embodiments, the electrical contacts 340 are compatible with a female socket on a motherboard, such that the module 330 can be plugged into the socket. The contacts 340 include a first set of contacts to provide signals to the packaged devices 306 and a second set of contacts to provide power to the heating element 334. Traces and vias (not shown) in the substrate 302 route signals from the first set of contacts 340 to the solder balls 304 of respective packaged devices 306 and route power from the second set of contacts 340 to the electrical connections 338 of the heating element 334.

For the modules 300 and 330 described above, the devices 306 to be annealed are mounted on both sides of the substrate. In some other embodiments, the devices to be annealed are mounted on a single side of a substrate. The heating element(s) may be mounted on either the same side or the opposite side of the substrate as the devices. In embodiments in which a heating element is mounted on the opposite side of the substrate as the device, the heating element is thermally coupled to the device through the substrate.

Figure 4:
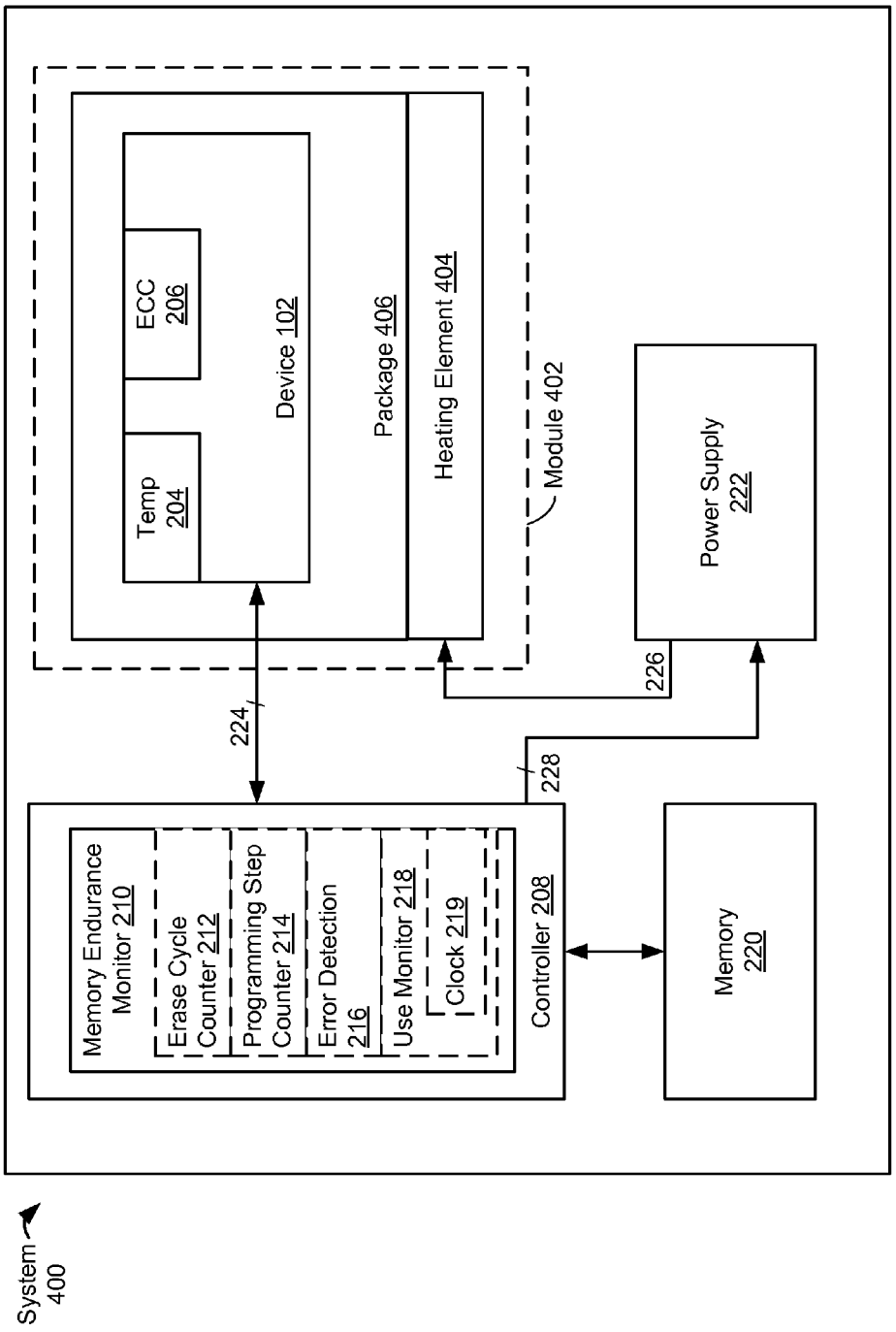
FIG. 4 is a block diagram of an electronic system that includes a module in accordance with some embodiments.

FIG. 4 is a block diagram of an electronic system 400 that includes a self-annealing module 402 in accordance with some embodiments. The module 402 includes a heating element 404 thermally coupled to a package 406. The package 406 includes a nonvolatile semiconductor memory device 102. In some embodiments, the module 402 corresponds to the module 300 or 330 of FIGS. 3A-3C and the heating element 404 corresponds to heating element 310 or 334. The system 400 may be any system that uses nonvolatile semiconductor memory such as flash memory. In some embodiments, the system 400 is a mobile application, such as a cell phone, PDA, or music player. In some embodiments, the system 400 is a computer system, such as a notebook or desktop PC or a server.

The system 400 includes a controller 208, memory 220, and power supply 222, which function as described for the system 200 (FIG. 2). In some embodiments, the controller 208, memory 220, and/or power supply 222 are located on the module 402 along with the package 406 and heating element 404.

Figure 5:
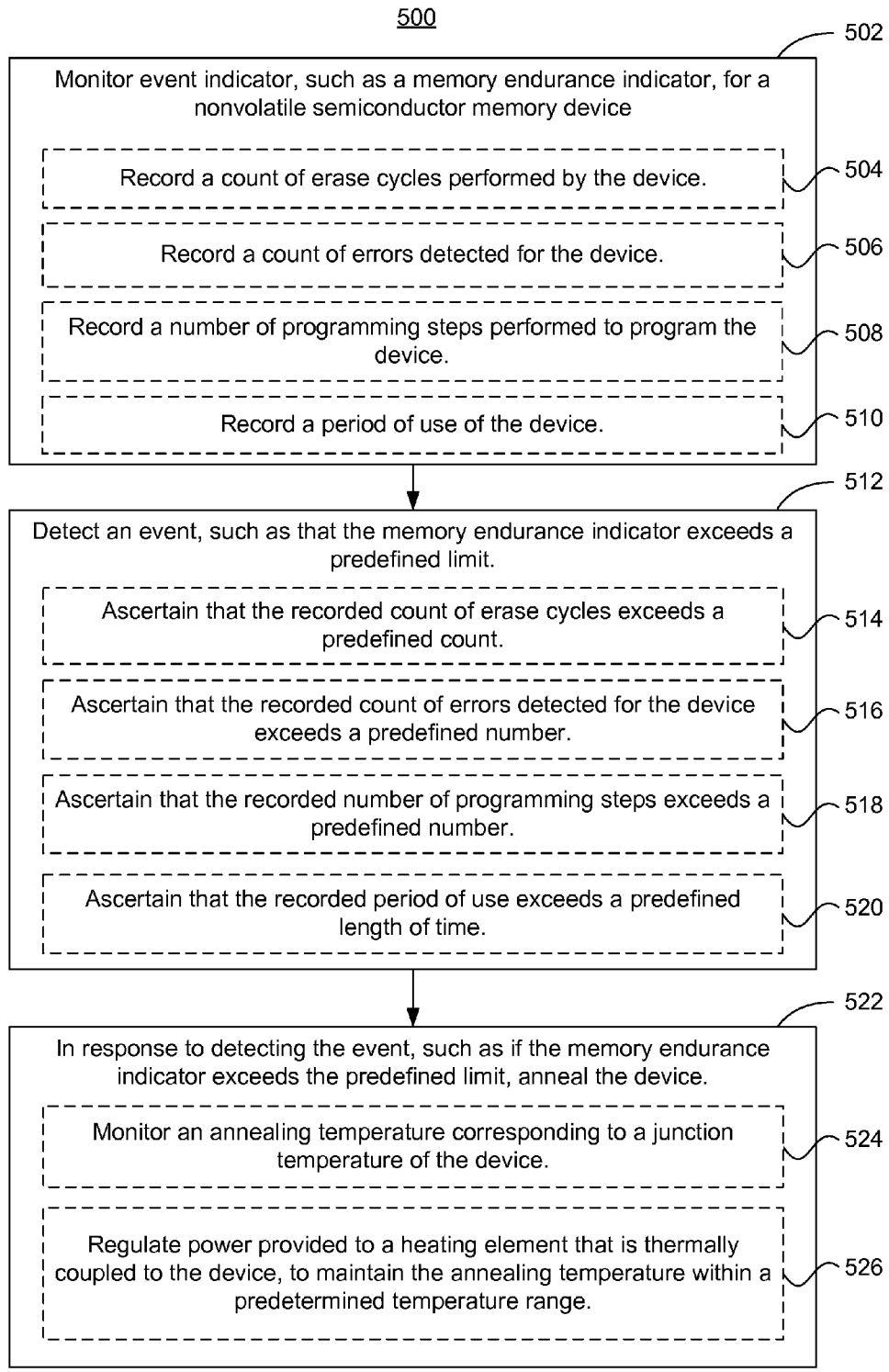
FIG. 5 is a flow diagram illustrating a method of repairing a nonvolatile semiconductor memory device in accordance with some embodiments.

FIG. 5 is a flow diagram illustrating a method 500 of annealing a nonvolatile semiconductor memory device in accordance with some embodiments.

An event (such as a memory endurance threshold) indicator is monitored (502) for a nonvolatile semiconductor memory device contained in a semiconductor package. In some embodiments the device corresponds to device 102 contained in package 202 (FIG. 2) or in package 406 (FIG. 4). In some embodiments, the event indicator is monitored by a controller (e.g., controller 208).

In some embodiments, monitoring the event indicator includes recording (504) a count of erase cycles performed by the device. For example, the erase cycle counter 212 in the controller 208 records a count of erase cycles performed by the device 102.

In some embodiments, monitoring the event indicator includes recording (506) a count of errors detected for the device. For example, error detection circuitry 216 in the controller 208 records an error count for the device 102.

In some embodiments, monitoring the event indicator includes recording (508) a number of programming steps performed to program the device. For example, the programming step counter 214 in the controller 208 records the number of programming steps performed to program the device 102.

In some embodiments, monitoring the event indicator includes recording (510) a period of use of the device. For example, the use monitor 218 in the controller 208 records a period of use of the device 102. Different definitions of the period of use are possible. For example, the period of use may be defined as a period of time for which the device has performed read and write operations, a period of time in which a system (e.g., 200 or 400) containing the device has been active, or a period of time since the system containing the device left the factory or was first activated.

In some embodiments, monitoring the event indicator includes determining whether the semiconductor device is receiving sufficient power for annealing to occur. For example, in mobile consumer electronics, such as MP3 players or cellular-telephones, the controller 208 or power supply 222 determines whether power is being received from an external charger plugged into a wall-outlet.

An event is then detected (512) (e.g., by the controller 208). For example, it is determined that the event indicator (e.g., memory endurance indicator) exceeds (512) a predefined limit or threshold. In some embodiments, it is ascertained that the recorded count of erase cycles exceeds (514) a predefined count. In some embodiments, it is ascertained that the recorded count of errors detected for the device exceeds (518) a predefined number. In some embodiments, it is ascertained that the recorded number of programming steps exceeds (518) a predefined number. In some embodiments, it is ascertained that the recorded period of use exceeds (520) a predefined length of time.

In response to detecting the event, the device is annealed (522). For example, it is determining that the memory endurance indicator exceeds the predefined limit. Annealing occurs, for example, by the controller 208 instructing the power supply 222 to supply power to the heating element 106 (FIG. 2) or 404 (FIG. 4), which is thermally coupled to the device.

In some embodiments, the annealing only occurs when an appropriate external physical event occurs. For example, if the nonvolatile semiconductor memory device is contained in a mobile consumer device, such as a MP3 player or cellular-telephone, and it is determined that annealing should occur, then annealing only occurs the next time that the device is coupled to an external power source, such as a charger plugged into a wall-outlet. This opportunistic annealing is useful given the limited power capability of some mobile consumer devices. Alternatively, annealing occurs even when the memory endurance monitor would not normally require annealing to occur, e.g., at predetermined intervals.

In some embodiments, an annealing temperature corresponding to a junction temperature of the device is monitored (524) (e.g., by a temperature sensor 204). In some embodiments, power provided to a heating element (e.g., 106 or 404) that is thermally coupled to the device is regulated (526) to maintain the annealing temperature within a predetermined range. For example, the controller 208 provides instructions to the power supply 222 to regulate power supplied to the heating element, based on feedback from the temperature sensor 204. In some embodiments, the predefined range of annealing temperatures corresponds to a range of junction temperatures of 200° C. to 300° C., or 200° C. to 250° C., 250° C. to 300° C., or even in some instances as low as 150° C.-200° C.

In some embodiments, the device is annealed for a predetermined period of time. For example, the nonvolatile memory cells of the type (i.e., of the cell design and process technology) used in the device 102 are characterized to determine a period of time sufficient to anneal out defects at a given junction temperature or range of junction temperatures. The controller 208 is programmed to anneal the device for the determined period of time at the corresponding annealing temperature or range of temperatures. In some embodiments, the period of time is 60-70 seconds. In some embodiments, the period of time is as short as 5-10 seconds, while in other embodiments the period of time is as long as tens of minutes. The period of time may be based on empirical data for the particular device(s), package, etc.

It should be appreciated that in some embodiments, the annealing temperature and duration of the annealing process is determined empirically for each new semiconductor device, package, or system design. For example, a prototype semiconductor device is first benchmarked by measuring operational characteristics such as the number of program/erase operations that can be performed within a certain time period, or how long it takes to program/erase a memory cell. Then the device is operated for an extended period of time until defects occur. Again, defects are measured against the benchmarked operational characteristics. The device is then annealed at a particular temperature and for a particular duration. The operational characteristics are again measured for improvement. The process may then be repeated for different annealing temperatures and/or durations using the same or similar devices to determine the optimum annealing temperature and duration for that particular device design. The same process may be used to determine the optimum annealing temperature and duration for semiconductor packages or systems.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A memory module comprising:
   a substrate;
   a plurality of memory devices disposed on the substrate, each of the memory devices having charge-storing memory cells that are subject to operation-induced defects that degrade ability of the memory cells to store data; and
   one or more discrete heating elements disposed in thermal contact with the plurality of memory devices to heat the memory devices to a temperature that anneals the defects.

2. The memory module of claim 1 wherein the one or more discrete heating elements comprises a plurality of discrete heating elements each disposed in thermal contact with a respective one of the memory devices.

3. The memory module of claim 1 wherein the one or more discrete heating elements comprises a first discrete heating element disposed in thermal contact with each of the memory devices.

4. The memory module of claim 3 wherein the memory devices are mounted inline on a surface of the substrate and disposed between the substrate and the first discrete heating element, and wherein the first discrete heating element extends across a length corresponding to a distance spanned by the inline the memory devices.

5. The memory module of claim 1 wherein the substrate comprises first and second substantially planar surfaces, and wherein the plurality of memory devices comprises a first plurality of memory devices disposed on the first surface of the memory module and a second plurality of memory devices disposed on the second surface of the memory module.

6. The memory module of claim 5 wherein the one or more discrete heating elements comprises a first plurality of discrete heating elements and a second plurality of discrete heating elements, each discrete heating element of the first plurality of discrete heating elements disposed in thermal contact with a respective memory device of the first plurality of memory devices, and each discrete heating element of the second plurality of discrete heating elements disposed in thermal contact with a respective memory device of the second plurality of memory devices.

7. The memory module of claim 5 wherein the one or more discrete heating elements comprises a first discrete heating element disposed in thermal contact with each memory device of the first plurality of memory devices, and a second discrete heating element disposed in thermal contact with each memory device of the first plurality of memory devices.

8. The memory module of claim 1 further comprising a thermal interface material disposed between the one or more discrete heating elements and the plurality of memory devices.

9. The memory module of claim 1 further comprising a cover attached to the one or more discrete heating elements, the one or more discrete heating elements and the plurality of memory devices being disposed between the substrate and the cover.

10. The memory module of claim 1 wherein the charge-storing memory cells comprise tunneling insulators through which charge-carriers tunnel to reach respective charge-storage elements.

11. The memory module of claim 1 wherein the charge-storing memory cells comprise floating gate storage elements.

12. The memory module of claim 1 wherein the charge-storing memory cells comprise SONOS (semiconductor-oxide-nitride-oxide semiconductor) storage elements.

13. The memory module of claim 1 wherein each of the plurality of memory devices comprises a respective semiconductor package.

14. The memory module of claim 1 wherein the one or more discrete heating elements is mounted to a first side of the substrate and the memory devices are mounted to a second side of the substrate opposite the first side, the one or more discrete heating elements being thermally coupled to the memory devices through the substrate.

15. The memory module of claim 1 further comprising one or more temperature sensors to enable monitoring of the temperature to which the one or more discrete heating elements heat the memory devices.

16. The memory module of claim 15 wherein the one or more temperature sensors comprises a plurality of temperature sensors, each temperature sensor disposed within a respective one of the plurality of memory devices.

17. The memory module of claim 1 further comprising electrical contacts disposed at an edge of the substrate to enable the memory module to be plugged into a socket.

18. A method of operating memory module, the method comprising:
performing, in memory devices of the memory module, operations that induce defects which degrade data storage ability of charge-storing memory cells within the memory devices; and
enabling one or more discrete heating elements of the memory module to heat the memory devices to a temperature that anneals the defects.

19. The method of claim 18 further comprising detecting an event that indicates a need to anneal defects within one or more of the memory devices of the memory module, and wherein enabling the one or more discrete heating elements comprises enabling the one or more discrete heating elements in response to detecting the event.

20. The method of claim 18 wherein enabling the one or more discrete heating elements comprises enabling each of a plurality of discrete heating elements that is thermally coupled to a respective one of the memory devices.

21. The method of claim 18 wherein enabling the one or more discrete heating elements comprises enabling a single discrete heating elements that is thermally coupled to each of the memory devices.

22. The method of claim 18 wherein the memory module comprises a substrate having first and second surfaces, memory devices of the memory module comprise a first plurality of memory devices disposed on the first surface of the substrate and a second plurality of memory devices disposed on the second surface of the substrate, and wherein enabling the one or more discrete heating elements comprises enabling a first set of one or more discrete heating elements thermally coupled to the first plurality of memory devices, and enabling a second set of one or more discrete heating elements thermally coupled to the second plurality of memory devices.

23. The method of claim 18 wherein enabling the one or more discrete heating elements to heat the memory devices comprises supplying power to the one or more discrete heating elements.

24. The method of claim 18 further comprising detecting a temperature detecting a temperature via a temperature sensor of the memory module, and wherein enabling the one or more discrete heating elements to heat the memory devices comprises regulating power supplied to the one or more discrete heating elements based on the temperature.

25. The method of claim 18 wherein enabling the one or more discrete heating elements to heat the memory devices comprises supplying power to the one or more discrete heating elements for a predetermined period of time.

26. The method of claim 18 wherein the charge-storing memory cells within the memory devices comprise floating gate storage elements.

27. The method of claim 18 wherein the charge-storing memory cells within the memory devices comprise SONOS (semiconductor-oxide-nitride-oxide semiconductor) storage elements.

28. An apparatus comprising:
means for performing, in memory devices of a memory module, operations that induce defects which degrade data storage ability of charge-storing memory cells within the memory devices; and
means for enabling one or more discrete heating elements of the memory module to heat the memory devices to a temperature that anneals the defects.

* * * * *